(12) United States Patent
Baur et al.

(10) Patent No.: US 6,366,465 B1
(45) Date of Patent: Apr. 2, 2002

(54) ARRANGEMENT FOR SECURING A CIRCUIT BOARD IN A HOUSING

(75) Inventors: Richard Baur, Pfaffenhofen; Guenter Fendt; Alfons Woehrl, both of Schrobenhausen; Engelbert Woerle, Kuehbach, all of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/483,602

(22) Filed: Jan. 14, 2000

(30) Foreign Application Priority Data

Jan. 16, 1999 (DE) .......................... 199 01 534

(51) Int. Cl.[7] ................................. H05K 7/14
(52) U.S. Cl. .................. 361/752; 361/759; 361/801; 361/804; 220/4.02; 211/41.17
(58) Field of Search .................. 361/740, 741, 361/742, 747, 748, 752, 756, 758, 759, 801, 802, 804; 211/41.17; 220/4.02

(56) References Cited

U.S. PATENT DOCUMENTS

| | | | |
|---|---|---|---|
| 4,270,820 A | * | 6/1981 | McMullan et al. ......... 312/242 |
| 4,760,495 A | | 7/1988 | Till |
| 5,285,353 A | | 2/1994 | Buck et al. |

FOREIGN PATENT DOCUMENTS

| | | |
|---|---|---|
| DE | G8810192 | 11/1988 |
| DE | G9109553 | 10/1991 |
| DE | G9115131 | 3/1992 |
| DE | G9306773 | 6/1994 |
| DE | G9411025 | 10/1994 |
| DE | G9321190 | 2/1998 |
| EP | 0712265 | 5/1996 |

* cited by examiner

Primary Examiner—Jayprakash N. Gandhi
(74) Attorney, Agent, or Firm—W. F. Fasse; W. G. Fasse (57) ABSTRACT

In order to secure a circuit board or the like in a housing, the board is provided with a through-hole, and the housing is provided with a mounting stud that protrudes into the housing from an outer wall thereof. A securing pin simultaneously passes through the through-hole of the board and into a hollow space or bore of the mounting stud. The securing pin is preferably conically tapered so that it exerts a wedging and spreading force radially outwardly against the inner surface of the hollow bore of the securing stud, and directly or indirectly against the inner surface of the through-hole of the board. Thereby, the board is securely fastened to the stud, and the pin is secured in the stud, by the wedging effect. An end portion of the stud may also be received in the through-hole of the board, and the pin may be integrally formed as a protrusion of a lid for the housing.

27 Claims, 3 Drawing Sheets

ARRANGEMENT FOR SECURING A CIRCUIT BOARD IN A HOUSING

PRIORITY CLAIM

This application is based on and claims the priority under 35 U.S.C. §119 of German Patent Application 199 01 534.1, filed on Jan. 16, 1999 the entire disclosure of which is incorporated herein by reference.

FIELD OF THE INVENTION

The invention relates to a securing arrangement in a housing, including holding means that fix the position and securely hold a circuit board or similar board, plate, card or panel in a housing.

BACKGROUND INFORMATION

It is typical in the motor vehicle manufacturing industry, that numerous electromechanical and/or electronic components, as well as circuit boards or similar supporting plates on which such components may be mounted, are arranged in housings so as to protect the several components from damage, dirt contamination, moisture, and the like. Especially in view of the shocks that will be applied to the housing and the components therein during operation of the motor vehicle, it is necessary that the various components and/or the boards arranged in the housing must be secured in a manner that is stable and resistant to such shocks.

A securing arrangement of the above described general type for securing circuit boards in a housing is disclosed in German Utility Model DE 93 21 190 U1. The conventional securing arrangement disclosed therein provides contact pins for holding the various components such as circuit boards and the like in a housing, and further provides spring clips for securing the contact pins and the components. On the one hand, the spring clips must be embodied in such a manner so that they securely grasp around and hold the contact pins and the circuit board, and on the other hand, the spring clips must ensure that they cannot be displaced from the proper positions on the respective contact pins. For these reasons, the spring clips must exert a large spring clamping force both onto the contact pin and onto the circuit board itself. Such a complicated arrangement and the required high clamping force that must be exerted by the spring clips increases the difficulty of assembling the arrangement in the housing, increases the cost of the various parts, and therefore increases the overall manufacturing cost of the arrangement.

It is also known from German Utility Model DE G 88 10 192.4, to secure a circuit board in a housing by passing a male pin through a cut-out in the circuit board and then into a cavity in a female pin, such that the circuit board is held between a protruding shoulder of the male pin and the end face of the female pin. Such an arrangement suffers the disadvantage that the position of the two pins relative to each other must be set with extreme precision. If the male pin is inserted slightly too far into the female pin, then the space between the protruding shoulder of the male pin and the end face of the female pin becomes too small to accommodate the thickness of the circuit board, and the board can easily be cracked by the application of an excessive clamping force in a direction parallel to the axis of the pins. On the other hand, if the male pin is inserted slightly not far enough into the female pin, then the space between the protruding shoulder of the male pin and the end face of the female pin becomes too large to properly constrain the circuit board therebetween, and the circuit board will not be held securely and durably in a fixed position.

SUMMARY OF THE INVENTION

In view of the above it is an object of the invention to provide a securing arrangement for securing a circuit board or the like in a housing, that may be manufactured in a cost-economical manner, and that may be assembled fully automatically with a high process reliability while also achieving high reliability of the permanent, secure holding of the board in the housing. The invention further aims to avoid or overcome the disadvantages of the prior art, and to achieve additional advantages, as are apparent from the present specification.

The above objects have been achieved in a securing arrangement according to the invention, comprising a housing that includes a housing wall and at least one formed housing part such as a protrusion or positioning and securing stud (also generally called a mounting stud herein), as well as at least one securing pin. The circuit board that is to be secured in the housing has a through-hole therein, which is aligned with a hollow space of the formed housing part. Throughout this specification, the term "circuit board" will be used as an example of a board that can be secured according to the invention, but such a board may be any type of supporting board, substrate, panel, card, or plate that is to be secured in a housing.

The securing pin is inserted or pushed through the through-hole of the board and into the hollow space in the formed housing part. Thereby, the securing pin directly or indirectly secures the board relative to the formed housing part in a force-locking frictional manner so that the board cannot be displaced in the housing. For example, the securing pin exerts a substantially radially outwardly directed wedging, spreading, or pressing force directly onto the board, or indirectly through the end portion of the formed housing part onto the board. More particularly, the securing arrangement may be configured according to either of two embodiments. In a first embodiment, an end of the formed housing part is arranged flush with the board, i.e. the board rests on a free end of the formed housing part, and the securing pin directly contacts and applies a wedging force to the inner surfaces of the through-hole of the board. In a second embodiment, an end portion of the formed housing part protrudes through the through-hole of the board, and the securing pin applies a wedging force to the end portion of the formed housing part so that the end portion applies a pressing force to the inner surfaces of the through-hole.

The inventive securing arrangement provides the significant advantage that the circuit board or other plate or panel can be securely, permanently, reliably, and easily positioned, held, and fixed in the housing without requiring any additional clamping elements such as screws, rivets, spring clips, clamps, or the like, and instead the entire securing is carried out by the securing pin or pins. The securing pin extends through the through-hole in the board that is to be secured, and thereby wedgingly or pressingly holds the board in a permanent and non-displaceable manner in the housing, in that the pin is pressed into the hollow space of the formed housing part to a greater or lesser extent, and thereby achieves an adjustable or controllable wedging, spreading, or pressing effect between the securing pin and the formed housing part, and directly or indirectly also with the board that is to be secured. In this manner, a reliable securing connection is achieved in a force-locking or frictional manner, with a very simple construction, using the same materials from which the housing and particularly the formed housing part is fabricated.

The invention avoids the need of a form-locking connection, for example a connection in which the board is clampingly held in a positive form-locked configuration between two clamping shoulders or the like. The inventive arrangement especially omits the use of any sort of rim, shoulder or protrusion of the securing pin that would press against the upper surface of the board so as to hold the board between such a rim or the like and a counter surface of the formed housing part or mounting stud. No clamping forces are applied to the board in a direction parallel to the axis of the securing pin and the mounting stud, but instead only substantially radial wedging forces are applied to the inner surface of the through-hole of the board to achieve the present frictional force-locking.

As a result, it is not necessary to position the securing pin with high precision to an exact position relative to the mounting stud, but instead the securing pin may simply be inserted into the stud until the required degree of wedging force is achieved. A gradual conical taper of the securing pin ensures that a relatively large range of insertion motion of the pin will provide a fine-tuning adjustment of the wedging or pressing force that is applied substantially radially outwardly onto the inner surface of the through-hole of the board. Since there is no danger that the board will be clamped too tightly or too loosely between two opposed clamping shoulders or the like, the associated dangers of cracking the board or of producing a too-loose connection are significantly reduced or eliminated.

The present secure connection can be automatically achieved during the assembly of the components in the housing. More particularly, the automatic assembly process simply involves positioning the circuit board or other board component so that its through-hole passes over an end portion of the formed housing part, or alternatively so that the circuit board lies flushly against an end surface of the formed housing part while the through-hole of the board is aligned with the axis of the hollow space of the housing part. Then, the securing pin is simply inserted and pushed through both the through-hole of the board and also the hollow space in the formed housing part, for example with a specified insertion force, to complete the securing connection. The steps can easily be carried out by automated assembly equipment.

According to a particular embodiment detail of the invention, the securing pin has a conical shape along its axial length, and the inner hollow space of the formed housing part includes at least hollow space sections along its axial length that have an inner diameter that is smaller than the outer diameter of the securing pin at the corresponding location of the pin when the securing pin is pushed into its proper secured position in the formed housing part. Thereby, a progressively tighter wedging or clamping effect can be achieved by inserting the securing pin successively further into the formed housing part, and the securing pin is reliably held in the formed housing part by the wedging interaction of the securing pin and the above mentioned hollow space sections that have a smaller inner diameter in comparison to the respective corresponding outer diameter of the securing pin. Of course, the above comparison of the diameters relates to the respective diameters of the components in an unassembled condition, because the insertion of the pin into the hollow space necessarily deforms at least the formed housing part so that the inner diameter of the hollow space corresponds with the outer diameter of the pin. With such a conical embodiment of the securing pin, a reliable and tight securing of the board in the housing can be achieved in a very simple manner by means of the resulting wedging, spreading, or pressing effect achieved by the securing pin inserted into the hollow space of the formed housing part.

Alternatively according to the invention, the securing pin may have a cylindrical configuration along its axial length. In this case, the hollow space of the formed housing part tapers or becomes narrower along its axial length so that the inner diameter of the hollow space at the free end of the formed housing part is larger than the outer diameter of the forward end of the securing pin. At least a section or portion of the hollow space tapers to a smaller inner diameter that is smaller than the outer diameter of the securing pin at the corresponding location once the securing pin is fully seated in its final secured position in the hollow space of the formed housing part. In such an embodiment, a very simple entirely cylindrical securing pin may be used.

Preferably, the panels, boards or plates that are to be secured in the housing are circuit boards or supporting boards carrying electromechanical and/or electronic components. The inventive securing arrangement serves to fix the position of the boards in the housing, and thereby securely holds the boards and the components mounted thereon within the housing.

Another detail of the invention provides that the housing further includes a cover or lid that closes the housing once the circuit board or the like has been arranged and secured therein. The housing lid includes a protruding shoulder or a protrusion that directly contacts and presses against the end surface of the free end of the securing pin protruding out of the formed housing part after the pin has been inserted into the formed housing part for securing the circuit board or the like. In this manner, the protrusion of the housing lid ensures that the securing pin cannot inadvertently be displaced out of its securing position in the formed housing part. For example, even severe shocks applied to the housing will not cause the securing pin to be released and displaced from its proper securing position. Also, the protrusion of the housing lid ensures that the securing pin has been pushed far enough into its securing position in the formed housing part, because if the securing pin protrudes too far out of the formed housing part, then the lid cannot be mounted and closed on the housing.

As a further alternative according to the invention, the securing pin may be directly formed as an integral part of the cover or lid for the housing, whereby the securing pin protrudes from the inner side of the lid that will be facing the interior of the housing once the lid closes the housing. In such an embodiment, the number of individual components to be assembled can be further reduced, and the secure clamping and holding of the circuit board in the housing is only achieved once the lid is placed and secured onto the housing so as to close the housing. In other words, before the lid is arranged to close the housing, the board is simply loosely arranged in the proper position so that the through-hole provided in the board is aligned with the hollow space of the formed housing part, and then the lid is placed on the housing. The formed housing part is located in the housing and the pin is located on the bottom or inner surface of the lid in such a corresponding manner, so that the securing pin protruding from the bottom surface of the lid necessarily passes through a corresponding through-hole of the circuit board and then into the underlying hollow space of the corresponding formed housing part when the housing lid is placed into its proper position for closing the housing. In this manner, the number of manufacturing steps necessary for assembling the several components is also reduced.

In a preferred embodiment of the invention, the securing pin has roughened sections, and/or protrusions, such as knurling, ribs, flutes, or barbs, on its outer circumferential surface. Such features provide an enhanced frictional engagement, or even an interlocking or grasping engagement between the securing pin and the formed housing part.

The securing pin and the housing are preferably made of a synthetic plastic, or of a carbon fiber reinforced composite material. Using these materials, the overall assembly and particularly the securing arrangement can be reduced in weight and cost, while achieving a good strength and protective function of the housing and good engagement between the securing pin and the formed housing part.

It is especially advantageous if the formed housing part includes radially and axially extending slots or slits passing from the hollow space through the wall of the formed housing part, at least at a section or portion along the axial length of the formed housing part. Particularly, such slits or slots should be provided at the protruding free end portion of the formed housing part. In such an embodiment, the segments of the wall of the formed housing part divided from each other by the radial slits or slots act as elastically deflectable tongues or tabs. Thus, the securing pin inserted into such a formed housing part spreads apart the elastically deflectable tongues in the slotted portion of the formed housing part. Consequently, the individual segments or tongues of the formed housing part are pressed outwardly against the inner surface of the through-hole of the circuit board into which the free end portion of the formed housing part protrudes, so that the circuit board is very securely held onto the spread-out end portion of the formed housing part by a wedging or spreading effect.

Throughout this specification, it should be understood that the inventive arrangement may comprise a single securing pin and mounting stud combination, or may comprise a plurality of the securing pins that respectively cooperate with a plurality of through-holes provided in the board and a plurality of the mounting studs provided in the housing. Each securing pin may have the same construction and function as the other pins, and each mounting stud may have the same construction and function as the other studs. The detailed description of a single component therefore applies as well to a plurality of similar components.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
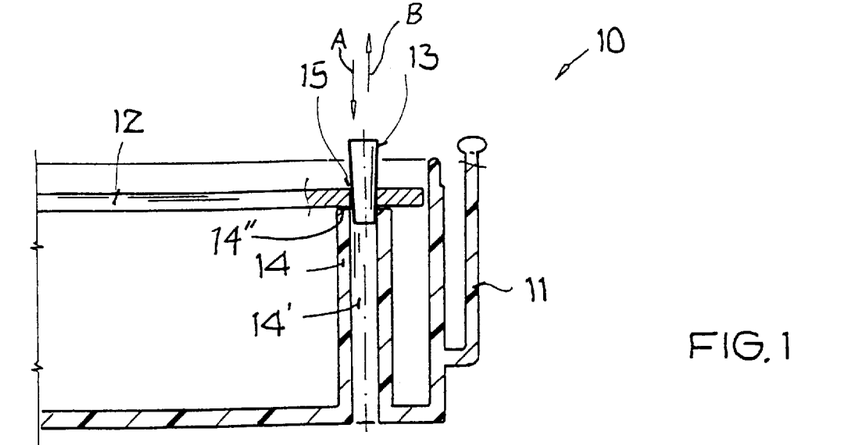
FIG. 1 is a schematic sectional view of a first embodiment of a securing arrangement according to the invention, showing a portion of a circuit board and a portion of a housing during the assembly process.

FIG. 1 shows a securing arrangement 10 according to the invention, which includes a housing 11, a board 12, and a securing pin 13, which is just being inserted into a formed housing part 14, e.g. a positioning and securing protrusion or mounting stud 14 of the housing 11. The positioning and securing stud or mounting stud 14 is formed as an integral part protruding from the bottom wall of the housing 11, and is made of a synthetic plastic or a carbon fiber reinforced composite material, for example. The board 12 may be a circuit board, or any other type of supporting panel, card, plate, or board that is to be secured in the housing 11. Only a portion of the housing 11, and a portion of the board 12 are respectively shown in FIG. 1. It should be understood, that a plurality of boards 12 can be secured in the housing 11 according to the invention, and a plurality of the inventive securing arrangements 10 can be used to secure each board 12 in the housing 11. Namely, a plurality of securing pins 13 and mounting studs 14 can be used to secure a single board 12 having a plurality of through-holes 15.

The mounting stud 14 has a hollow space 14', e.g. a hollow center or bore therein with an opening at the free end of the mounting stud 14, and the board 12 has a through-hole 15 therein. In the embodiment of FIG. 1, the board 12 is positioned in the housing 11 so that the through-hole 15 aligns with the hollow space 14' of the mounting stud 14, while the board 12 rests flushly on the free end face 14" of the mounting stud 14. Then, the securing pin 13 is inserted in the direction of arrow A so that it passes through the through-hole 15 of the board 12 and into the hollow space 14' of the mounting stud 14. Since the securing pin 13 has a slight conical taper along its axial length, it presses radially outwardly against the inner walls of the through-hole 15 of the board 12 and of the hollow space 14' of the mounting stud 14 as the securing pin 13 is pressed axially into the hollow space 14'. Thereby, a wedging or outward pressing effect tightly secures the pin 13 both to the board 12 and to the mounting stud 14 of the housing 11, while the board also rests against the free end face 14" of the mounting stud 14. In this manner, the inserted securing pin 13 provides a durable force-locking secure connection between the board 12 and the housing 11. In order to release this connection, the securing pin 13 may be pulled out of the hollow space 14' of the mounting stud 14 in the direction of arrow B. Thereafter the board 12 may be removed from the housing 11.

Figure 2:
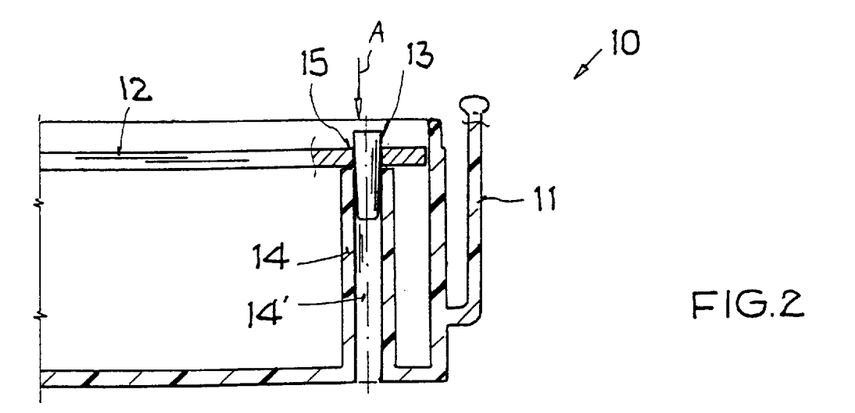
FIG. 2 is a view of the arrangement according to FIG. 1, but with a securing pin having been driven into the formed housing part or mounting stud of the housing.

FIG. 2 shows the condition or state in which the securing pin 13 securely holds the board 12 in the housing 11, in that the pin 13 has been pressed in the direction of arrow A sufficiently into the hollow space 14' of the mounting stud 14 so as to achieve the required wedging or pressing effect on both the board 12 and the mounting stud 14. Of course, the respective inner diameters of the through-hole 15 and the hollow space 14' must be properly adapted to the tapering outer diameter of the pin 13 to achieve the required degree of radial wedging when the pin 13 is inserted into the proper axial position or position range in the hollow space 14'.

The pin 13 may be an individual separate component that is inserted into the through-hole 15 of the board 12 after the board 12 has been positioned on the free end 14" of the mounting stud 14 as described above. Alternatively, the securing pin 13 may initially be temporarily attached to the board 12 in a position of the pin 13 extending into or through the through-hole 15. For example, the pin 13 may be formed as an integral part of the board 12, whereby the pin 13 is initially connected by a frangible link or tab forming a breakable connection between the pin 13 and the board 12. For example, the pin 13 may be integrally molded with the board 12, whereby the through-hole 15 is originally formed by molding an annular ring into the board 12, while a thin breakable flange or individual webs connect the pin 13 to the board 12. Then, when an axial driving force is applied to the pin 13, the breakable web or flange is broken, and the pin 13 is pushed through the through-hole 15 and into the hollow space 14' of the mounting stud 14.

Figure 3:
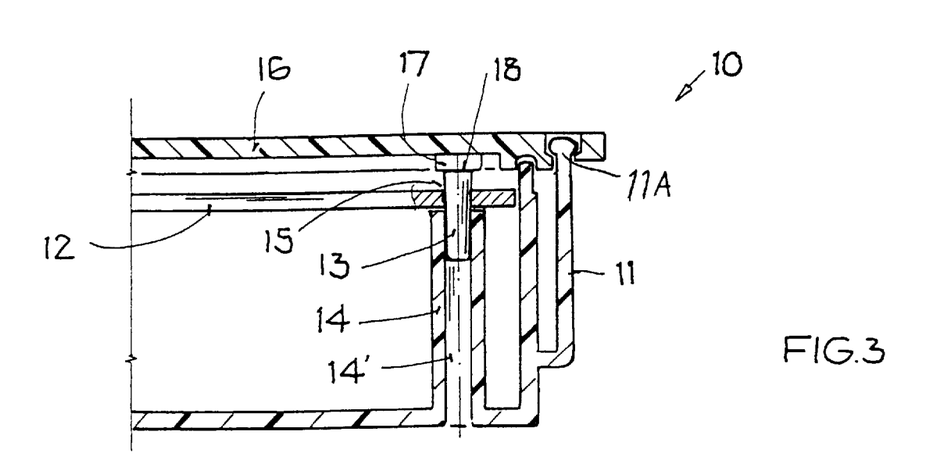
FIG. 3 is a schematic sectional view of the arrangement of FIG. 2, further in combination with a housing lid that covers the housing and presses against the securing pin.

FIG. 3 shows the arrangement according to FIGS. 1 and 2, further in combination with a cover or lid 16 for the housing 11. As described above, the pin 13 has been inserted into the mounting stud 14 to directly secure the board 12 onto the mounting stud 14, and thus onto the housing 11. The lid 16 is secured onto the housing 11 in any known manner, for example by being snapped onto a rim bead 11A of the housing 11. The lid 16 includes a shoulder or protrusion 17 on an inner surface thereof (i.e. the surface facing the board 12 and the interior of the housing 11 in the assembled condition). The protrusion 17 is positioned and dimensioned so that it presses against the end surface 18 of the securing pin 13 in the assembled condition. Thereby, the securing pin 13 is held in its proper inserted position, and is prevented from inadvertently being displaced back out of the mounting stud 14.

Figure 4:
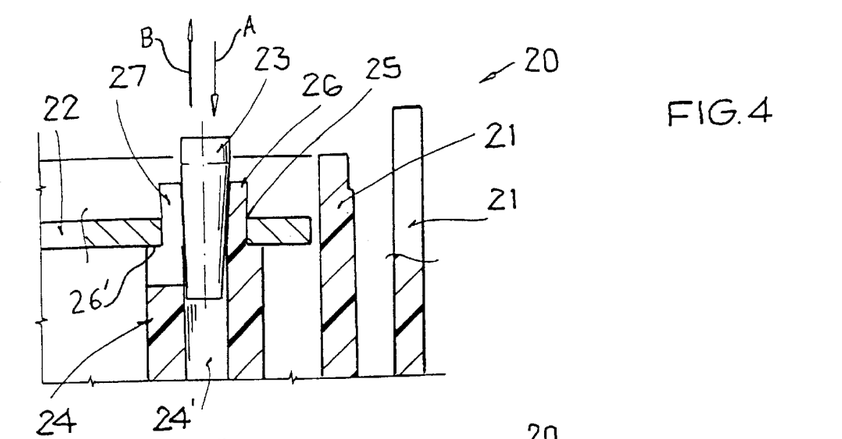
FIG. 4 is an enlarged detailed sectional view of a second embodiment of a securing arrangement according to the invention in which an end portion of the mounting stud protrudes through a hole of the circuit board, and is secured by the securing pin.

FIG. 4 shows an enlarged view of a smaller portion of a securing arrangement 20 according to another embodiment of the invention. Particularly, FIG. 4 shows a portion of the housing 21, and a portion of a board 22 that is to be secured in the housing 21. The securing pin 23 reaches into a hollow space 24' of a formed housing part 24, i.e. a protrusion or mounting stud 24. In this embodiment, the mounting stud 24 includes an end portion 26 that has a reduced outer diameter relative to the remaining shaft portion of the mounting stud 24. Thus, an annular positioning shoulder 26' is formed between the end portion 26 and the remaining shaft portion of the mounting stud 24.

Figure 8:
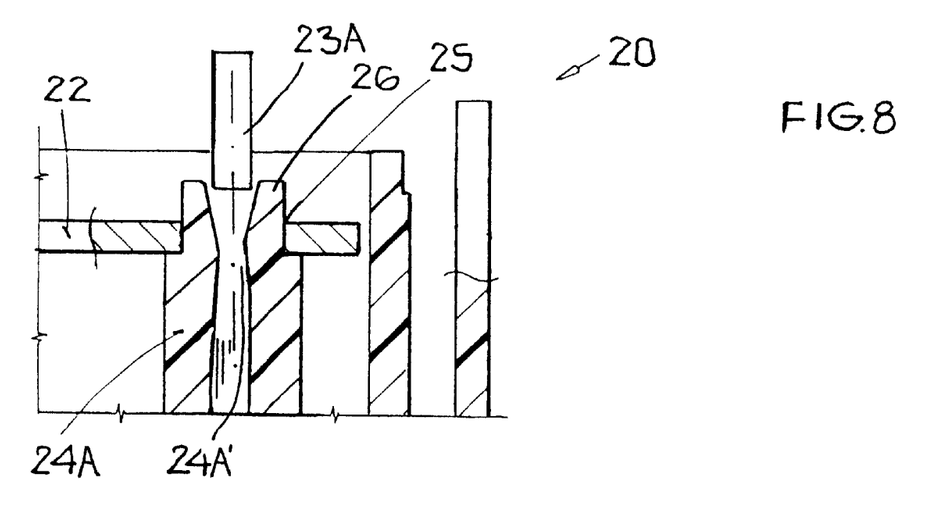
FIG. 8 is a sectional view similar to FIG. 4, but showing an alternative with a cylindrical securing pin and a tapering hole in the mounting stud.

As further shown in FIG. 4, the end portion 26 of the mounting stud 24 passes through a through-hole 25 of the board 22, so that the board 22 is supported and located on the positioning shoulder 26' of the stud 24. Then the securing pin 23 is inserted and pushed into the hollow space 24' inside the mounting stud 24 in the direction of arrow A so as to spread apart the end portion 26 by a wedging effect, and thereby to wedge the end portion 26 against the inner walls of the through-hole 25 so as to secure the board 22 onto the mounting stud 24. In FIG. 4, the securing pin 23 has a conical taper. In the alternative of FIG. 8, the securing pin 23A has a cylindrical shape, while the hollow space 24A' of the stud 24A tapers conically in the direction of insertion of the pin 23A.

In this embodiment, the securing pin 23 may be a separate individual component, or may initially be formed integrally with the mounting stud 24, for example by integral molding. In the latter case, the pin 23 is initially connected to the stud 24 by a frangible link, web or flange. If the pin 23 is initially an integral part of the stud 24, it is very simple to position the board 22 and then pass the through-hole 25 over the pin 23 and end portion 26 of the stud 24 so that the board 22 comes to rest on the positioning shoulder 26'. The frangible link is broken once the pin 23 is driven in the direction of arrow A. To release the secured connection between the board 22 and the stud 24, the pin 23 may be pulled out in the direction of arrow B.

In order to facilitate and improve the wedging, spreading or expanding effect of the securing pin 23 acting against the end portion 26 of the mounting stud 24, the end portion 26 preferably has as least one slot or slit 27 extending axially therealong and passing radially through the wall thickness of the mounting stud 24, or particularly the end portion 26 thereof. While a single slot 27 is apparent in the view of FIG. 4, a circumferentially regular pattern of three slots 27 is visible in th e view of FIG. 5. The three slots 27 divide the end portion 26 into three tongue-like or tab-like segments that can each be radially outwardly deflected by the wedging action of the securing pin 23. Thereby, a greater expansion of the end portion 26 can be achieved while requiring a lower wedging force, as compared to a configuration without the slots 27. The elastic nature of the material of which the stud 24 and particularly the end portion 26 is made, causes the tongue-like or tab-like segments of the end portion 26 to retract radially inwardly into their initial positions if the securing pin 23 is pulled out in the direction of arrow B. Thereby, the board 22 will be released so that it can be dismounted or removed from its position seated on the shoulder 26' of the stud 24.

Figure 5:
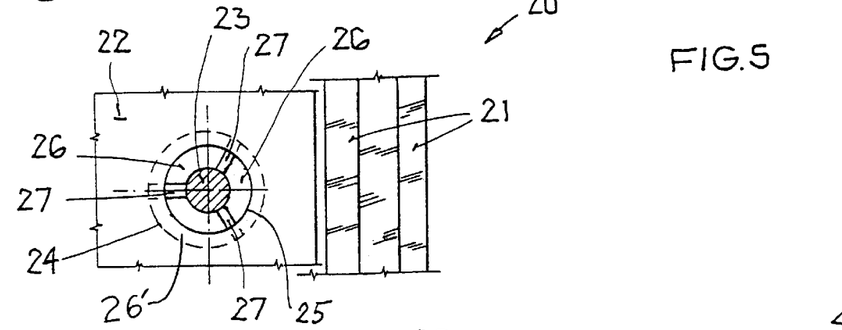
FIG. 5 is a schematic top view of the arrangement shown in FIG. 4.
Figure 6:
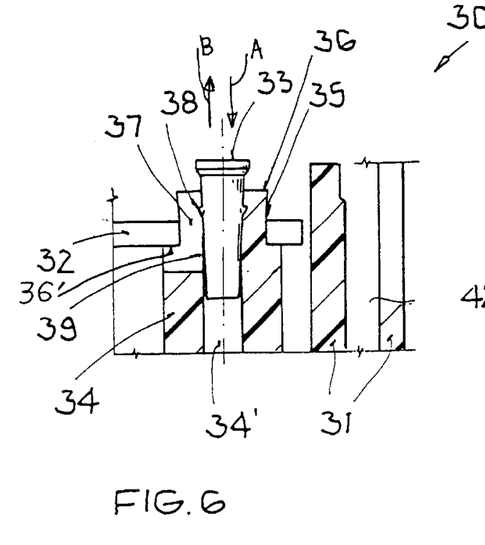
FIG. 6 is a view similar to that of FIG. 4, but showing a further embodiment in which a securing pin includes additional holding barbs.

FIG. 6 shows a securing arrangement 30 that is generally similar to the securing arrangement 20 that has been described in connection with FIGS. 4 and 5 above. The securing arrangement 30 relates to a housing 31 and a board 32 that is to be secured in the housing 31 by means of a securing pin 33 that is pushed into a hollow space 34' of a formed housing part 34 such as a mounting stud 34, which protrudes integrally from the housing wall, for example. A respective one of several through-holes 35 provided in the board 32 is pushed over an end portion 36 of the stud 34 until the board 32 comes to rest on a shoulder 36' of the stud 34. The end portion 36 of the stud 34 may have one or more slots or slits 37 similar to the slots 27 described above.

The outer circumferential surface of the securing pin 33 is provided with barbs or protrusions 38 and/or roughened sections, which provide an increased frictional and deformational engaging between the outer surface of the pin 33 and the inner surface of the hollow space 34' of the mounting stud 34. Thus, when the securing pin 33 is pushed in the direction of arrow A into the hollow space 34' of the stud 34, the protrusions or barbs 38 provide an especially good and secure engagement and holding of the pin 33 into the stud 34. Thereby the conical wedge-shaped pin 33 spreads apart the respective segments of the end portion 36 of the stud 34, whereby the end portion 36 becomes pressed and secured against the inner surfaces of the through-hole 35 of the board 32. If the secured connection is to be released, the pin 33 may be pulled out in the direction of arrow B, whereby it is necessary to exert an increased pulling force to the pin 33 as compared to the barb-less pin 23 described above.

Figure 7:
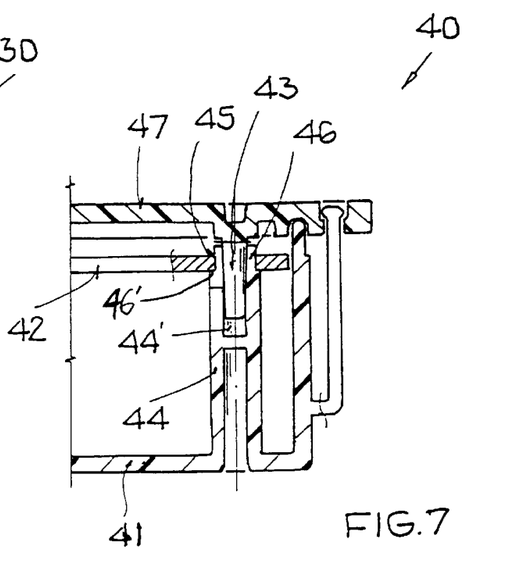
FIG. 7 is a schematic sectional view of another embodiment of a securing arrangement according to the invention, in which a securing pin is formed as an integral protruding part of the housing lid.

A further embodiment of a securing arrangement 40 according to the invention is shown in FIG. 7. This arrangement 40 is generally similar to the arrangement 20 described above, except that the securing pin 43 is formed as an integral protruding part of a cover or lid 47 of the housing 41. More particularly, the arrangement 40 shown in FIG. 7 comprises a housing 41 and a board 42 that is to be secured in the housing 41 by means of a securing pin 43, which protrudes and is secured into a hollow space 44' of a formed housing part or mounting stud 44 of the housing 41. The hollow space 44' of the stud 44 is embodied as a blind hole that is open only on the free end of the stud 44 facing the lid 47. A second blind hole extends into the stud 44 from the bottom wall of the housing 41, but a divider wall divides the two blind holes from each other. Thereby, a more reliable sealing of the housing against the penetration of moisture or the like can be achieved, and the stud 44 is strengthened.

Similarly as in FIGS. 4 to 6 described above, an end portion 46 of the stud 44 protrudes through the through-hole 45 provided in the board 42 until the board 42 rests on a shoulder 46' of the stud 44. The end portion 46 is preferably divided into a plurality of segments by radial slots or slits similarly as described above. The securing pin 43 protrudes from the inner or bottom surface of the housing lid 47, and is preferably integrally molded or otherwise formed as an integral protrusion of the lid 47. When the lid 47 is set onto the housing 41 and securely engaged onto the housing 41, the respective pin or pins 43 protruding from the lid 47 will correspondingly be inserted and engaged into respective mounting studs 44. Thus, each pin 43 engaging into the respective corresponding stud 44 while the lid 47 is secured onto the housing 41, will simultaneously secure the board 42 in the housing 41 by the wedging effect of the pin or pins 43. As a result, the board 42 will be securely and non-displaceably held in the housing 41 once the lid 47 is fastened thereon.

A common feature of the invention in all of the above described embodiments for securing a board or the like in a housing is that a securing pin simultaneously passes through a through-hole provided in the board and into a hollow space provided in a securing stud that protrudes from the housing. The pin is preferably conically tapered, so that it exerts a substantially radially directed wedging or spreading force against at least a portion of the securing stud and either directly or indirectly against the inner surface of the through-hole of the board. Thereby, the securing pin is securely engaged and held in the securing stud, and the board is held frictionally and secured against the stud so as to be fixed in the housing. The inventive arrangements do not use a shoulder or clamping part that clampingly presses against a top surface of the board, so as to clamp the board against a support surface of the mounting stud.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An arrangement for securely holding a board in a housing, comprising:
   a housing including a housing wall and a mounting stud, wherein said mounting stud protrudes from said housing wall, has a board support surface formed by an end face at a free end of said mounting stud protruding away from said housing wall, and has a hollow space therein with an opening at said free end;
   a board that has a through-hole passing therethrough; and
   a securing pin with opposite front and back ends, wherein at least said front end has an outer dimension that is smaller than an inner dimension of said through-hole and smaller than an inner dimension of said opening at said free end of said mounting stud;
   wherein said housing, said board and said securing pin are assembled into an assembled configuration in which a first surface of said board contacts and lies flushly on said board support surface of said mounting stud, with said through-hole of said board coaxially aligned with said opening at said free end of said mounting stud, and in which said securing pin has been inserted coaxially through said through-hole and said opening and with said front end into said hollow space, so that said securing pin is engaged in said hollow space of said mounting stud and said securing pin bears directly against and exerts a radially outwardly directed spreading force directly onto an inner surface of said through-hole so that said securing pin is in direct frictional holding contact with said inner surface of said through-hole to frictionally hold said board relative to said mounting stud of said housing.

2. The arrangement according to claim 1, wherein said securing pin has an outer shape that conically tapers along an axial length of said pin from said back end to said front end, said outer dimension of said front end is a smallest outer dimension of said securing pin, and said hollow space has at least a portion with an inner diameter that is smaller in an unassembled configuration, in which said securing pin is not inserted into said hollow space, than an outer diameter of said securing pin at a location along said securing pin that is positioned at said portion of said hollow space in said assembled configuration.

3. The arrangement according to claim 1, wherein said board is a circuit board including a supporting board and electronic components mounted on said supporting board.

4. The arrangement according to claim 1, wherein said securing pin and said housing each consist essentially of at least one of a synthetic plastic and a carbon fiber reinforced composite material.

5. The arrangement according to claim 1, wherein an outer surface of said securing pin includes at least one of roughened portions, protrusions, and barbs.

6. The arrangement according to claim 1, further comprising a lid that is arranged to cover an opening of said housing in said assembled configuration and that has an inwardly-facing surface, and wherein, in said assembled configuration, said lid is arranged with said inwardly-facing surface facing toward said board and directly contacting and pressing against said back end of said securing pin.

7. The arrangement of claim 6, wherein said inwardly-facing surface of said lid includes a base surface and a protrusion that protrudes from said base surface inwardly into said housing toward said board, and wherein said protrusion of said inwardly-facing surface contacts and presses against said back end of said securing pin.

8. The arrangement according to claim 1, further comprising a lid that is adapted to cover an opening of said housing in said assembled configuration, wherein said back end of said securing pin is integrally connected to said lid so that said securing pin integrally protrudes from said lid.

9. The arrangement according to claim 1, wherein said board is only frictionally held by said securing pin exerting a radially outwardly directed wedging force to said inner surface of said through-hole, without a positive form-locking clamped connection of said board relative to said mounting stud.

10. The arrangement according to claim 1, wherein no holding force is applied to said board in a direction directly parallel to an axis of said securing pin.

11. The arrangement according to claim 1, wherein said securing pin does not include any part that contacts or exerts a holding force directly or indirectly onto a second surface of said board opposite said first surface which contacts said board support surface of said mounting stud.

12. The arrangement according to claim 1, wherein the only contacts of said board with said mounting stud and said securing pin are a contact between said first surface of said board and said board support surface of said mounting stud, and a contact between said inner surface of said through-hole of said board and a radially outer surface of said securing pin.

13. The arrangement according to claim 1, wherein said securing pin is at all times a non-integral independent part relative to said board and said mounting stud.

14. The arrangement according to claim 1, further comprising a frangible link, wherein, in an unassembled configuration before said securing pin is inserted into said hollow space of said mounting stud into a final position of said securing pin in said assembled configuration, said securing pin is connected integrally to said board by said frangible link, and said frangible link is broken when said securing pin is inserted into said final position in said hollow space in said assembled configuration, and wherein broken remainders of said frangible link remain connected to said securing pin and to said board respectively in said assembled configuration.

15. The arrangement according to claim 1, further comprising a frangible link, wherein, in an unassembled configuration before said securing pin is inserted into said hollow space of said mounting stud into a final position of said securing pin in said assembled configuration, said securing pin is connected integrally to said mounting stud by said frangible link, and said frangible link is broken when said securing pin is inserted into said final position in said hollow space in said assembled configuration, and wherein broken remainders of said frangible link remain connected to said securing pin and to said mounting stud respectively in said assembled configuration.

16. An arrangement for securely holding a board in a housing, comprising:

a housing including a housing wall and a mounting stud, wherein said mounting stud comprises a shaft portion that protrudes from said housing wall, an end portion that extends from said shaft portion, terminates at a free end, and has an outer dimension that is smaller than an outer dimension of said shaft portion adjacent a junction between said shaft portion and said end portion, and a board support surface formed by a shoulder surface at said junction between said shaft portion and said end portion, and said mounting stud has a hollow space therein with an opening at said free end;

a board that has a through-hole passing therethrough; and a securing pin with opposite front and back ends, wherein at least said front end has an outer dimension that is smaller than an inner dimension of said through-hole and smaller than an inner dimension of said opening at said free end of said mounting stud;

wherein said housing, said board and said securing pin are assembled into an assembled configuration in which said end portion of said mounting stud extends into said through-hole of said board with said through-hole of said board coaxially aligned with said opening at said free end of said mounting stud, a first surface of said board contacts and lies against said shoulder surface of said mounting stud, and said securing pin has been inserted coaxially through said through-hole and said opening and with said front end into said hollow space, so that said securing pin is engaged in said hollow space of said mounting stud and bears against said end portion and exerts a radially outwardly directed spreading force through said end portion indirectly onto an inner surface of said through-hole so that an outer surface of said end portion is in direct frictional holding contact with said inner surface of said through-hole to frictionally hold said board relative to said mounting stud of said housing; and wherein said end portion has at least one slit that extends radially and axially therein and passes through a wall thickness of said end portion surrounding said opening.

17. The arrangement according to claim 16, wherein said end portion has at least two of said slits that divide said end portion into at least two tab-like end portion segments that can be deflected and spread radially outwardly apart from each other.

18. An arrangement for securely holding a board in a housing, comprising:

a housing including a housing wall and a mounting stud, wherein said mounting stud comprises a shaft portion that protrudes from said housing wall, an end portion that extends from said shaft portion, terminates at said free end, and has an outer dimension that is smaller than an outer dimension of said shaft portion adjacent a junction between said shaft portion and said end portion, and a board support surface formed by a shoulder surface at said junction between said shaft portion and said end portion, and said mounting stud has a hollow space therein with an opening at said free end;

a board that has a through-hole passing therethrough;

a securing pin with opposite front and back ends, wherein at least said front end has an outer dimension that is smaller than an inner dimension of said through-hole and smaller than an inner dimension of said opening at said free end of said mounting stud; and a lid that is arranged to cover an open area of said housing and that has an inwardly-facing surface;

wherein said housing, said board and said securing pin are assembled into an assembled configuration in which said end portion of said mounting stud extends into said through-hole of said board with said through-hole of said board coaxially aligned with said opening at said free end of said mounting stud, a first surface of said board contacts and lies against said shoulder surface of said mounting stud, and said securing pin has been inserted coaxially through said through-hole and said opening and with said front end into said hollow space, so that said securing pin is engaged in said hollow space of said mounting stud and bears against said end portion and exerts a radially outwardly directed spreading force through said end portion indirectly onto an inner surface of said through-hole so that an outer surface of said end portion is in direct frictional holding contact with said inner surface of said through-hole to frictionally hold said board relative to said mounting stud of said housing; and wherein said lid is arranged with said inwardly-facing surface facing toward said board and with said back end of said securing pin integrally joined with said inwardly-facing surface or being contacted and pressed against by said inwardly-facing surface.

19. The arrangement according to claim 18, wherein said inwardly-facing surface of said lid contacts and presses against said back end of said securing pin.

20. The arrangement of claim 19, wherein said inwardly-facing surface of said lid includes a base surface and a protrusion that protrudes from said base surface inwardly into said housing toward said board, and wherein said protrusion of said inwardly-facing surface contacts and presses against said back end of said securing pin.

21. The arrangement according to claim 18, wherein said back end of said securing pin is integrally joined with said inwardly-facing surface and said securing pin integrally protrudes from said lid.

22. The arrangement according to claim 18, wherein said securing pin has an outer shape that conically tapers along an axial length of said pin from said back end to said front end, said outer dimension of said front end is a smallest outer dimension of said securing pin, and said hollow space has at least a portion with an inner diameter that is smaller in an unassembled configuration, in which said securing pin is not inserted into said hollow space, than an outer diameter of said securing pin at a location along said securing pin that is positioned at said portion of said hollow space in said assembled configuration.

23. The arrangement according to claim 18, wherein said securing pin has a cylindrical outer shape extending along an axial length of said pin from said back end to said front end, and said hollow space has at least a portion with an inner diameter that is smaller in an unassembled configuration, in which said securing pin is not inserted into said hollow space, than said opening at said free end and than an outer diameter of said cylindrical outer shape of said securing pin.

24. The arrangement according to claim 23, wherein said hollow space has an inner shape that conically tapers from said opening in a direction toward said housing wall from which said mounting stud protrudes, in said unassembled configuration.

25. The arrangement according to claim 18, wherein an outer surface of said securing pin includes at least one of roughened portions, protrusions, and barbs.

26. The arrangement according to claim 18, wherein said securing pin is at all times a non-integral independent part relative to said board and said mounting stud.

27. The arrangement according to claim 18, further comprising a frangible link, wherein, in an unassembled configuration before said securing pin is inserted into said hollow space of said mounting stud into a final position of said securing pin in said assembled configuration, said securing pin is connected integrally to said board by said frangible link, and said frangible link is broken when said securing pin is inserted into said final position in said hollow space in said assembled configuration, and wherein broken remainders of said frangible link remain connected to said securing pin and to said board respectively in said assembled configuration.

* * * * *